United States Patent
Matsumoto et al.

(10) Patent No.: US 6,207,536 B1
(45) Date of Patent: *Mar. 27, 2001

(54) METHOD FOR FORMING A THIN FILM OF A COMPOSITE METAL COMPOUND AND APPARATUS FOR CARRYING OUT THE METHOD

(75) Inventors: Shigeharu Matsumoto; Kazuo Kikuchi, both of Tokyo; Masafumi Yamasaki; Qi Tang, both of Yokohama; Shigetaro Ogura, Kohbe, all of (JP)

(73) Assignee: Shincron Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,645

(22) Filed: Jun. 9, 1998

(30) Foreign Application Priority Data

Mar. 27, 1998 (JP) .................................. 10-098246

(51) Int. Cl.⁷ .................................. H01L 21/20
(52) U.S. Cl. .................. 438/478; 438/478; 438/758; 438/795; 438/798
(58) Field of Search .................... 438/478, 689, 438/758–799; 205/123, 157

(56) References Cited

U.S. PATENT DOCUMENTS 4,420,385 * 12/1983 Hartsough ................... 204/192 R
4,434,038 * 2/1984 Morrison, Jr. ................ 204/192 R (List continued on next page.)

FOREIGN PATENT DOCUMENTS

| | | |
|---|---|---|
| 328257 | 1/1989 | (EP) . |
| 409451 | 6/1990 | (EP) . |
| 428358 | 11/1990 | (EP) . |
| 497499 | 1/1992 | (EP) . |
| 719874 | 12/1995 | (EP) . |
| 56-147829 | 11/1981 | (JP) . |
| 56-147830 | 11/1981 | (JP) . |
| 756001 | 3/1995 | (JP) . |
| 8146358 | 6/1996 | (JP) . |
| 8190002 | 7/1996 | (JP) . |
| 8225932 | 9/1996 | (JP) . |
| 9263937 | 10/1997 | (JP) . |
| 9418359 | 2/1993 | (WO) . |

OTHER PUBLICATIONS

S. Wolf & R. Tauber Silicon Processing vol. 1 Lattice Press p. 348–360, 1986.*
S. Wolf & R. Tauber, Silicon Processing for the VLSI Era, vol. 1 Lattice Press, Calif. p. 548–563. 1986.*
S. Wolf & R. Tauber, Silicon Processing for the VLSI Era, vol. 1 Lattice Press, Calif. p. 532–535, 1986.*
Tang, Ogura, Yamasaki, and Kikuchi, J. Vac. Sci. A 15(5), Sep./Oct. 1997, pp. 2670–2672.

*Primary Examiner*—Matthew Smith
*Assistant Examiner*—Granvill Lee
(74) *Attorney, Agent, or Firm*—Lorusso & Loud

(57) ABSTRACT

There is disclosed a method and apparatus for forming a thin film of a composite metal compound. Independent targets formed of at least two different metals are sputtered so as to form on a substrate an ultra-thin film of a composite metal or an incompletely-reacted composite metal. The ultra-thin film is irradiated with the electrically neutral, activated species of a reactive gas so as to convert the composite metal or the incompletely-reacted composite metal to a composite metal compound through the reaction of the ultra-thin film with the activated species of the reactive gas. The formation of the ultra-thin film and the conversion to the composite metal compound are sequentially repeated so as to form on the substrate a thin film of the composite metal compound having a desired thickness.

11 Claims, 4 Drawing Sheets

U.S. PATENT DOCUMENTS

| | | | |
|---|---|---|---|
| 4,851,095 | * | 7/1989 | Scobey et al. .................. 204/192.12 |
| 5,124,013 | * | 6/1992 | Seddon et al. .................. 204/192.12 |
| 5,154,810 | * | 10/1992 | Kamerling et al. ............. 204/192.13 |
| 5,225,057 | * | 7/1993 | Lefebvre et al. ............... 204/192.13 |
| 5,618,388 | * | 4/1997 | Seeser et al. ................... 204/192.12 |
| 5,670,030 | * | 9/1997 | Solberg et al. ................. 204/192.26 |
| 5,772,862 | * | 6/1998 | Ando et al. .......................... 204/298 |
| 5,798,027 | * | 8/1998 | Lefebvre et al. ............... 204/192.26 |
| 5,868,897 | * | 2/1999 | Ohkawa ................................ 156/345 |
| 5,879,519 | * | 3/1999 | Seeser et al. ................... 204/192.12 |
| 5,962,923 | * | 10/1999 | Xu et al. .............................. 257/774 |
| 6,103,320 | * | 8/2000 | Matsumoto et al. ................. 427/535 |

* cited by examiner

METHOD FOR FORMING A THIN FILM OF A COMPOSITE METAL COMPOUND AND APPARATUS FOR CARRYING OUT THE METHOD

BACKGROUND OF THE INVENTION

1. Field of the Invention

The present invention relates to a method for forming a thin film of a composite metal compound and an apparatus for carrying out the method. More particularly, the invention relates to a method for forming through sputtering a thin film of a composite metal compound on a substrate in a stable manner and at a high rate of deposition and to an apparatus for carrying out the method.

2. Description of the Related Art

Conventionally, when optical thin films for various groups of products are formed through use of only existing vapor deposition materials, satisfactory performances as required by the products are very difficult to obtain. That is, designing optical thin films through use of mere substances existing in the natural world has proved difficult in terms of attaining optical spectral characteristics as required by a certain group of products.

For example, configuration of wide-band antireflection films requires materials having an intermediate refractive index (between 1.46 and 2.20), which materials rarely exist in the natural world.

Generally, in order to decrease the reflectance of, for example, glass, over the entire wavelength range of visible light, glass must be coated with a vapor deposition material having a refractive index of 1.46–2.20, called an intermediate refractive index. Materials having an intermediate refractive index are limited, and the refractive index cannot be selected as desired. Accordingly, the following techniques are known as alternative techniques for obtaining an intermediate refractive index in the above-mentioned range.

(1) A low-refraction material (e.g. $SiO_2$ (refractive index: 1.46)) and a high-refraction material (e.g. $TiO_2$ (refractive index: 2.35)) are concurrently evaporated from respective evaporation sources, and an intermediate refractive index (1.46–2.40) is obtained by virtue of their mixing ratio; (2) a low-refraction material and a high-refraction material are concurrently evaporated from a single evaporation source in the form of a mixture, and an intermediate refractive index (1.46–2.40) is obtained by virtue of their mixing ratio; (3) an intermediate refractive index is equivalently obtained through the combination of a low-refraction material and a high-refraction material (called the equivalent film technique); and (4) a composite target material is used in sputtering.

However, the above-mentioned techniques involve the following disadvantages.

In the above-mentioned technique (1), wherein a low-refraction material (e.g. $SiO_2$ (refractive index: 1.46)) and a high-refraction material (e.g. $TiO_2$ ((refractive index: 2.35)) are concurrently evaporated from respective evaporation sources and an intermediate refractive index (1.46–2.40) is obtained by virtue of their mixing ratio, the stable deposition of a film through the simultaneous control of the rates of deposition from the two evaporation sources is difficult to achieve, and thus a desired refractive index is difficult to obtain with good reproducibility.

In the above-mentioned technique (2), wherein a low-refraction material and a high-refraction material are concurrently evaporated from a single evaporation source in the form of a mixture and an intermediate refractive index is obtained by virtue of their mixing ratio, when evaporation continues for a long period of time, the refractive index changes due to differences in melting point and vapor pressure between the low-refraction material and the high-refraction material. As a result, a desired refractive index is difficult to obtain stably.

In the above-mentioned technique (3), wherein an intermediate refractive index (1.46–2.40) is obtained through use of an equivalent film formed from combined use of low-refraction and high-refraction materials, a given refractive index requires the formation of a very thin layer; thus, the control of film thickness becomes difficult and complicated.

As mentioned above, the conventional techniques fail to concurrently implement a high, stable deposition rate, a wide range of refractive index variation, and a simple control system.

SUMMARY OF THE INVENTION

An object of the present invention is to provide a method for forming a thin film of a composite metal compound capable of controlling the refractive index of a thin film as desired, forming an ultra-thin film while subjecting the ultra-thin film to oxidation, nitriding, fluorination, or a like reaction, and forming on a substrate a thin film of a metallic compound having stable optical characteristics, dynamic characteristics, and like characteristics without increasing the substrate temperature and at a high rate of deposition as well as to provide an apparatus for carrying out the same.

Another object of the present invention is to provide a method for forming a thin film of a composite metal compound capable of obtaining a wide range of refractive index variation through use of a simple control system and to provide an apparatus for carrying out the same.

The above objects are achieved by the method and apparatus according to the present invention. Herein, the expression "ultra-thin film" is used to distinguish between a final thin film and the plurality of ultra-thin films which are deposited to become the final thin film, and describes each of the ultra-thin films as being substantially thinner than the final thin film. The expression "activated species" refer to radicals, radicals in an excited state, atoms in an excited state, molecules in an excited state, and the like. A "radical" refers to an atom or molecule having at least one unpaired electron. An "excited state" denotes the state in which the energy level is higher as compared to the stable ground state having the lowest energy.

The embodiments of the present invention will next be described in detail.

First Embodiments:

According to a first embodiments of the present invention, there is provided a method for forming a thin film of a composite metal compound in which first, independent targets formed of at least two different metals are sputtered so as to form on a substrate an ultra-thin film of a composite metal or an incompletely-reacted composite metal. For example, one of two targets is formed of Si, while the other target is formed of Ta.

Next, the thus-formed ultra-thin film (e.g. Si+Ta) on the substrate is irradiated with the electrically neutral, activated species of a reactive gas (e.g. activated species of oxygen gas) so as to convert the composite metal or the incompletely-reacted composite metal to a composite metal compound (e.g. a composite of $SiO_2$ and $Ta_2O_2$) through reaction of the ultra-thin film with the activated species of the reactive gas. The above-mentioned steps of forming an ultra-thin film and converting the ultra-thin film to a composite metal compound are sequentially repeated so as to form on a substrate a thin film of a composite metal compound having a desired thickness.

In a reactive film deposition step in which a composite metal compound is obtained from a composite metal or an incompletely-reacted composite metal, a reactive gas enriched in activated species is used for the following reason. For the chemical reaction in the film deposition step, chemically active, electrically neutral, activated species, such as radicals and excited species, are more decisively important than are charged particles, such as ions and electrons.

Activated species are generated through use of a plasma source for generating high-density plasma connected to a radio-frequency power source. Specifically, the plasma source is an inductively-coupled or capacitively-coupled plasma source or a helicon wave plasma source having an external or internal coil. As to the capacitively-coupled plasma source, it has an external or internal coil as the case may be. In order to obtain high-density plasma, a magnetic field of 20–300 gauss is generated in a plasma generation unit.

A voltage (usually a negative voltage) applied to each of the targets is inverted at 1–200 kHz intervals to a positive voltage ranging between +50 V and +200 V to thereby neutralize, with electrons in plasma, positive charges which accumulate in a compound to be formed on the surface, particularly an uneroded portion thereof, of each of the targets. Thus, through the temporary inversion to a positive voltage from a negative voltage, the positive-charged state on the surfaces of the targets is neutralized, so that the voltage of the targets can be held at a normal level.

FIGS. 4 to 6 show the relationship between electric power and optical characteristics, such as refractive index, absorption, heterogeneity, etc., for $Ta_xSi_yO_z$ films. In FIGS. 4 to 6, optical constants are calculated based on data regarding the spectral characteristics of a single-layer film. As shown in FIG. 4, the refractive indices of $Ta_xSi_yO_z$ films vary with the ratio of the power applied to one guide to the power applied to the other guide.

As seen from FIG. 4, as the applied power ratio between the Si cathode and the Ta cathode increases, the refractive index decreases. Since the vapor deposition rate is fixed at 40 nm/min, the illustrated relationship between the refractive index and the applied power ratio holds. As a result, the minimum and maximum refractive indices at a wavelength of 550 nm are found 1.463 and 2.182, respectively. As the applied power ratio increases, the refractive index at a wavelength of 550 nm increases from 1.463 to 2.182. Also, the refractive index can be decreased from 2.182 to 1.463.

In deposition of a thin film of a composite metal compound having a desired thickness on a substrate as described above, when two metals are respectively sputtered through, for example, magnetron sputtering, any refractive index within the range between the refractive index intrinsic to one metal compound and the refractive index intrinsic to the other metal compound (e.g. the range between 1.46 and 2.25, wherein 1.46 is the refractive index of $SiO_2$, an Si compound, and 2.25 is the refractive index of $Ta_2O_2$, a Ta compound) can be imparted to the thin film through appropriate control of the power applied to the magnetron sputtering targets.

The film deposition process will next be described with reference to FIG. 3, which illustrates the process of forming a thin film of a composite metal compound on a substrate.

First, a substrate is placed in the position of a first metal target. The first metal target is sputtered so as to form a very thin metallic film (ultra-thin film) on the substrate. Then, the substrate is moved to the position of a second metal target. The second metal target is sputtered so as to form a very thin metallic film (ultra-thin film) on the substrate. As shown in FIG. 3, the first and second metals are homogeneously deposited on the substrate to form an ultra-thin film. That is, an ultra-thin film of a composite metal or an incompletely-reacted composite metal is formed on the substrate.

The thus-formed ultra-thin film is finally irradiated with the electrically neutral, activated species of a reactive gas so as to convert the composite metal or the incompletely-reacted composite metal to a composite metal compound through the reaction of the ultra-thin film with the activated species of the reactive gas. Specifically, the ultra-thin film is oxidized in the position of a radical source. The step of forming the ultra-thin film and the step of conversion to the composite metal compound are sequentially repeated so as to form on the substrate a thin film of the composite metal compound having a desired thickness.

In this first embodiment, a substrate may be transferred or fixed so long as the step of forming an ultra-thin film and the step of conversion to a composite metal compound are sequentially repeated so as to form on the substrate a thin film of the composite metal compound having a desired thickness.

Second Embodiment:

According to a second embodiment of the present invention, there is provided an apparatus for forming a thin film of a composite metal compound, comprising a vacuum chamber, film deposition process chambers, a reaction process chamber, and separation means (e.g. shield plates). In the film deposition process chambers, a working gas (e.g. argon gas) is introduced thereinto, and independent targets formed of at least two different metals (e.g. Si and Ta in the case of two different metals) are sputtered so as to form on a substrate an ultra-thin film of a composite metal or an incompletely-reacted composite metal.

In the reaction process chamber, the ultra-thin film (e.g. Si and Ta) formed in the film deposition process chambers is irradiated with the electrically neutral, activated species of a reactive gas (e.g. the activated species of oxygen) so as to convert the composite metal or the incompletely-reacted composite metal to a composite metal compound (e.g. $SiO_2$ and $Ta_2O_2$) through the reaction of the ultra-thin film with the activated species of the reactive gas. The separation means is adapted to separate the reaction process chamber from the film deposition process chambers in terms of space and pressure by means of shield plates.

The shield plates serving as the separation means define within the vacuum chamber separate spaces which serve as the reaction process chamber and the film deposition process chambers. That is, the thus-defined spaces within the vacuum chamber are not completely separated from each other, but maintain a substantially independent state so as to serve as the reaction process chamber and film deposition process chambers which can be controlled independently of each other. Thus, the reaction process chamber and the film deposition process chambers are configured to be least influential to each other so that optimum conditions can be established in each of the chambers.

Thus, the separation means prevents the reactive gas (e.g. the activated species of oxygen) from mixing with the working gas (e.g. argon gas) in the film deposition process chambers so that there can be sequentially repeated a stable film deposition process and a reaction process to thereby form on a substrate a thin film of a composite metal compound having a desired thickness.

As in the case of the first embodiment, the activated species of a reactive gas used in the reaction process chamber are electrically neutral radicals (atoms or molecules having at least one unpaired electron, or atoms or molecules in an excited state). Also, in the present aspect, a magnetron sputtering device may serve as a thin film deposition device.

The reactive gas enriched in electrically neutral, activated species is generated by means of: a radio-frequency discharge chamber comprising a quartz tube, around which a radio-frequency coil is wound; a radio-frequency power source for applying power to the radio-frequency coil via a matching box; reaction gas feed means for introducing a reactive gas from a gas cylinder into the radio-frequency discharge chamber via a mass flow controller; an external or internal coil for generating a magnetic field of 20–300 gauss within the radio-frequency discharge chamber; and a multi-aperture grid, a multi-slit grid, or a like grid disposed between the radio-frequency discharge chamber and the reaction process chamber.

A multi-aperture grid is formed of a metal or an insulator in which are formed a number of apertures having a diameter of 0.1–3 mm, and is cooled. A multi-slit grid is formed of a metal or an insulator in which are formed a number of slits having a width of 0.1–1 mm, and is cooled.

Preferably, a cooling measure, such as a water-cooling measure, is provided for the multi-aperture grid or multi-slit grid. The cooling measure may employ a known technique. Such a grid causes ions and electrons in plasma to mutually exchange charges on the surface of the grid to thereby introduce into the reaction process chamber only activated species which are reactive and are not charged, i.e. which are electrically neutral.

As in the case of the first embodiment, a voltage (usually a negative voltage) applied to each of the targets is inverted at 1–200 kHz intervals to a positive voltage ranging between +50 V and +200 V to thereby neutralize, with electrons in plasma, positive charges which accumulate in a compound to be formed on the surface, particularly an uneroded portion thereof, of each of the targets.

Third Embodiment:

According to a third embodiment of the present invention, there is provided a method for forming a thin film of a composite metal compound in which a thin film of a composite metal compound having a desired thickness is formed on a substrate in a manner similar to that of the first embodiment and in which there is imparted to the thin film any refractive index within the range between the optical refractive index intrinsic to a constituent metal compound of the thin film and the optical refractive index intrinsic to another constituent metal compound of the thin film.

That is, the present embodiment is characterized in that there is imparted to the thin film any refractive index within the range between the optical refractive index intrinsic to a constituent metal compound of a thin film of a composite metal compound and the optical refractive index intrinsic to another constituent metal compound of the thin film.

As described in connection with the first embodiment with reference to FIG. 3, Si serving as a first metal and Ta serving as a second metal, for example, are sputtered, and the aforementioned film deposition process is repeated to form a composite oxide film.

Through the control of the magnitude of power applied to the first metal target and that of power applied to the second metal target, the refractive index of a thin film can be varied. For example, as shown in FIG. 4, the refractive index of a thin film varies with the ratio between the power applied to Si serving as the first metal and the power applied to Ta serving as the second metal. Accordingly, through the continuous variation of the power applied to the two targets according to a predetermined ratio, a refractively gradient film can be formed.

As in the case of the preceding embodiments, the electrically neutral, activated species of a reactive gas are radicals (atoms or molecules having at Least one unpaired electron, or atoms or molecules in an excited state). Also, the above-mentioned sputtering may be magnetron sputtering. Further, a voltage (usually a negative voltage) applied to each of the targets is inverted at 1–200 kHz intervals to a positive voltage ranging between +50 V and +200 V to thereby neutralize, with electrons in plasma, positive charges which accumulate in a compound to be formed on the surface, particularly an uneroded portion thereof, of each of the targets.

Fourth Embodiment:

According to a fourth embodiment of the present invention, there is provided an apparatus for forming a thin film of a composite metal compound, comprising the features of the second embodiment and transfer means for sequentially and repeatedly transferring a substrate between thin film deposition portions for forming a thin film through sputtering, which thin film deposition portions correspond to the aforementioned film deposition process chambers, and an exposure-to-radicals portion for exposing a thin film to radicals of a reactive gas emitted from a radical source, which exposure-to-radicals portion corresponds to the aforementioned reaction process chamber. A thin film of a composite metal compound is formed on the substrate through the sequentially repeated transfer of the substrate between the thin film deposition portions and the exposure-to-radicals portion. Also, there is imparted to the thin film any refractive index within the range between the optical refractive index intrinsic to a constituent metal compound of a thin film of a composite metal compound and the optical refractive index intrinsic to another constituent metal compound of the thin film.

According to the present embodiment, a substrate is held by an electrically-insulated substrate holder so as to prevent the occurrence of an unusual discharge on the substrate. As in the case of the preceding embodiments, the activated species of a reactive gas used in the reaction process chamber are electrically neutral radicals (atoms or molecules having at least one unpaired electron, or atoms or molecules in an excited state); a magnetron sputtering device serves as a film deposition device; and a negative voltage applied to each of the targets is inverted at 1–200 kHz intervals to a positive voltage ranging between +50 V and +200 V to thereby neutralize, with electrons in plasma, positive charges which accumulate in a compound to be formed on the surface, particularly an uneroded portion thereof, of each of the targets. Also, the mechanism of the generation of the activated species, a grid, and shield means are similar to those of the preceding embodiments.

Fifth Embodiment:

According to a fifth embodiment of the present invention, a thin film of a composite metal compound is formed on a substrate in a manner similar to that of the first embodiment, and any optical characteristics are imparted to the thin film through the continuous variation of the refractive index of the thin film in the direction of the thickness of the thin film within the range between the optical refractive index intrinsic to a constituent metal compound of the thin film and the optical refractive index intrinsic to another constituent metal compound of the thin film.

Next will be described, as examples, a 3-layer antireflection film having an intermediate-refractive-index layer and a 2-layer antireflection film having a refractively gradient layer. Their film configurations are, for example, as follows:

(1) substrate/M($\lambda$/4)/2H($\lambda$/2)/L($\lambda$/4)/air; and (2) substrate/G/L($\lambda$/4)/air (G: refractively gradient layer).

In this case, the refractive index of the intermediate-refractive-index layer M is represented by $n_m = n_1\sqrt{n_s}$, where $n_m$ is the refractive index of the intermediate-refractive-index layer M, $n_1$ is the refractive index of the low-refractive-index layer, and ns is the refractive index of the substrate. The 2-layer antireflection film is designed based on the conventional 2-layer antireflection design called w-coat; specifically substrate/2H($\lambda$/2)/L($\lambda$/4)/air. FIG. 7 shows the calculated and measured spectral curves of the 3-layer and 2-layer antireflection films. As seen from FIG. 7, the calculated values and the measured values are in good coincidence. In the case of the 2-layer antireflection film, the high-refractive-index layer of the conventional w-coat is replaced by a refractively gradient layer, thereby expanding the range of antireflection.

As mentioned above, through the continuous variation of the refractive index of a thin film in the direction of the thickness of the thin film, any optical characteristics can be imparted to the thin film.

In the above-described embodiments, two sputterers are used for sputtering two kinds of metals. However, three or more sputterers may be used. Such a configuration is feasible because the film deposition process chambers and the reaction process chamber are separated from each other by the shield means and can be controlled independently.

Thus, the present invention yields the following advantages: the refractive index can be controlled to any value within the range between the respective refractive indices intrinsic to a plurality of metals to be sputtered; an ultra-thin film can be formed while the ultra-thin film is undergoing oxidation, nitriding, fluorination, or a like reaction; and a thin film of a metallic compound having stable optical characteristics, dynamic characteristics, and like characteristics can be formed on a substrate without increasing the substrate temperature and at a high rate of deposition. Also, a wide range of refractive index variation can be obtained through use of a simple control system.

DESCRIPTION OF THE PREFERRED EMBODIMENTS

Figure 1:
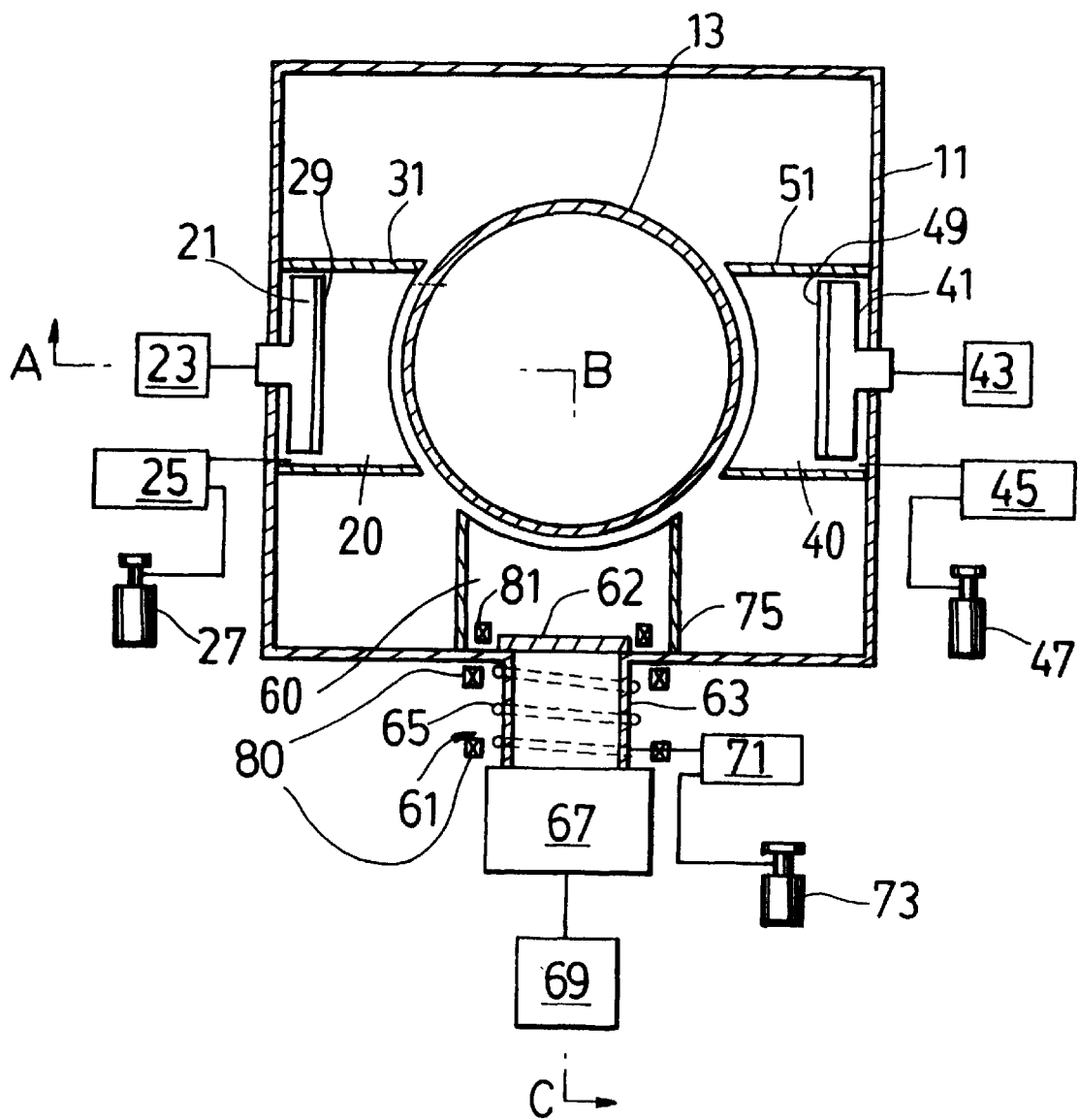
FIG. 1 is a schematic view showing an apparatus for forming a thin film.

An apparatus S for forming a thin film according to an embodiment of the present invention includes a vacuum chamber 11, film deposition process chambers 20 and 40, a reaction process chamber 60, shield plates 31, 51, and 75 (which serve as separation means or shield means), a substrate holder 13 and drive means thereof (which serve as transfer means), and means for generating activated species.

The vacuum chamber 11 is formed of a closed hollow container having any shape. The substantially cylindrical substrate holder 13 is disposed at the center of the vacuum chamber 11 in a manner rotatable at a predetermined speed. The film deposition process chambers 20 and 40 and the reaction process chamber 60 are disposed around the substrate holder 13 and within the vacuum chamber 11.

The film deposition process chambers 20 and 40 are enclosed with the shield plates 31 and 51, respectively, independently of each other, and have at least two sputterers.

The film deposition process chambers 20 and 40 are disposed opposite each other with respect to the substrate holder 13. The film deposition process chambers 20 and 40 are defined by the shield plates 31 and 51, respectively.

The shield plates 31, 51, and 75 define separate spaces which serve as the film deposition process chambers 20 and 40 and the reaction process chamber 60 (which will be described later), respectively, in a vacuum atmosphere established within the vacuum chamber 11. The thus-defined spaces are not completely separated from each other, but are substantially independent of each other and serve as the film deposition process chambers 20 and 40 and the reaction process chamber 60, which are independently controllable.

Accordingly, the film deposition process chambers 20 and 40 and the reaction process chamber 60 are configured to be least influential to each other so that optimum conditions can be established in each of the chambers 20, 40, and 60. Preferably, the pressure of the film deposition process chambers 20 and 40 is set higher than that of the reaction process chamber 60.

Such pressure setting prevents a reactive gas (e.g. oxygen gas) in the reaction process chamber 60 from entering the film deposition process chambers 20 and 40. Thus, there can be prevented the occurrence of an unusual discharge which would otherwise result due to the formation of a metallic compound on the surfaces of targets 29 and 49. For example, the pressure (the degree of vacuum) of the film deposition process chambers 20 and 40 is preferably $0.8-10\times10^{-3}$ Torr, and the pressure (the degree of vacuum) of the reaction process chamber 60 is preferably $0.5-8\times10^{-3}$ Torr, thereby establishing the condition that the pressure of the film deposition process chambers 20 and 40 is greater than that of the reaction process chamber 60.

The film deposition process chambers 20 and 40 have sputtering electrodes 21 and 41, respectively. Spaces in front of the sputtering electrodes 21 and 41 serve as sputtering film deposition portions.

The film deposition process chambers 20 and 40 are connected to sputtering gas cylinders 27 and 47 via mass flow controllers 25 and 45, respectively. A sputtering gas, such as argon, is introduced from the cylinders 27 and 47 into the film deposition process chambers 20 and 40, respectively, to thereby establish a regulated sputtering atmosphere within the film deposition process chambers 20 and 40. Through the application of power from sputtering power sources 23 and 43, sputtering is performed. In the present embodiment, a low-refraction material is used as the target 29. Examples of such a low-refraction material include Si. Also, a high-refraction material is used as the target 49. Examples of such a high-refraction material include Ti, Zr, Ta, and Nb.

The reaction process chamber 60 includes an activated-species generator 61, which serves as a radical source, for generating the activated species of a reactive gas and a grid 62. The grid 62 may be a multi-aperture grid or a multi-slit grid.

The activated-species generator 61 may be an inductively-coupled type, a capacitively-coupled type, or a inductively, capacitively-coupled type and has external or internal electrodes. A capacitively-coupled type, has external or internal electrodes as the case may be.

The activated-species generator 61 includes a radio-frequency (RF) discharge chamber 63 formed of a quartz tube and a radio-frequency (RF) coil 65 wound on the RF discharge chamber 63. A radio-frequency (RF) power source 69 applies power (a high-frequency power of 100 kHz to 50 MHz) to the RF coil 65 via a matching box 67. At the same time, a reactive gas, such as oxygen gas, is introduced from a reactive gas cylinder 73 into the RF discharge chamber 63 via a mass flow controller 71. As a result, the plasma of the reactive gas is generated. Examples of such a reactive gas include oxidizing gases such as oxygen and ozone, nitriding gases such as nitrogen, carbonating gases such as methane, and fluorinating gases such as $CF_4$.

In order to obtain a high-density plasma, a magnetic field of 20–300 gauss is generated within the quartz tube through use of the external coil 80 or the internal coil 81. The grid 62 disposed at the connecting portion between the quartz tube and the vacuum chamber 11 is adapted to enrich the electrically neutral, activated species relative to the electrically charged species by releasing only activated species into the reaction process chamber 60.

The multi-aperture grid serving as the grid 62 is formed of a metal or an insulator in which are formed a number of apertures having a diameter of 0.1–3 mm, and is cooled. The multi-slit grid serving as the grid 62 is formed of a metal or an insulator in which are formed a number of slits having a width of 0.1–1 mm, and is cooled.

Through use of the grid 62, there are selectively introduced into the reaction process chamber 60 the activated species of a reactive gas, i.e. radicals, radicals in an excited state, atoms in an excited state, and molecules in an excited state, while charged particles such as electrons and ions cannot pass through the grid 62 and thus cannot enter the reaction process chamber 60. Accordingly, in the reaction process chamber 60, a metallic ultra-thin film is not exposed to the above-mentioned charged particles, but is exposed only to electrically neutral activated species of a reaction gas and reacts with the activated species to thereby be converted from a metallic thin film of Si and Ta or the like to a thin film of a composite metal compound ($SiO_2$ and $Ta_2O_2$).

The transfer means of the present embodiment is adapted to sequentially and repeatedly transfer a substrate between thin film deposition portions for forming a thin film through sputtering, which thin film deposition portions correspond to the film deposition process chambers 20 and 40, and an exposure-to-radicals portion for exposing a thin film to radicals of a reactive gas emitted from a radical source, which exposure-to-radicals portion corresponds to the reaction process chamber 60.

Figure 2:
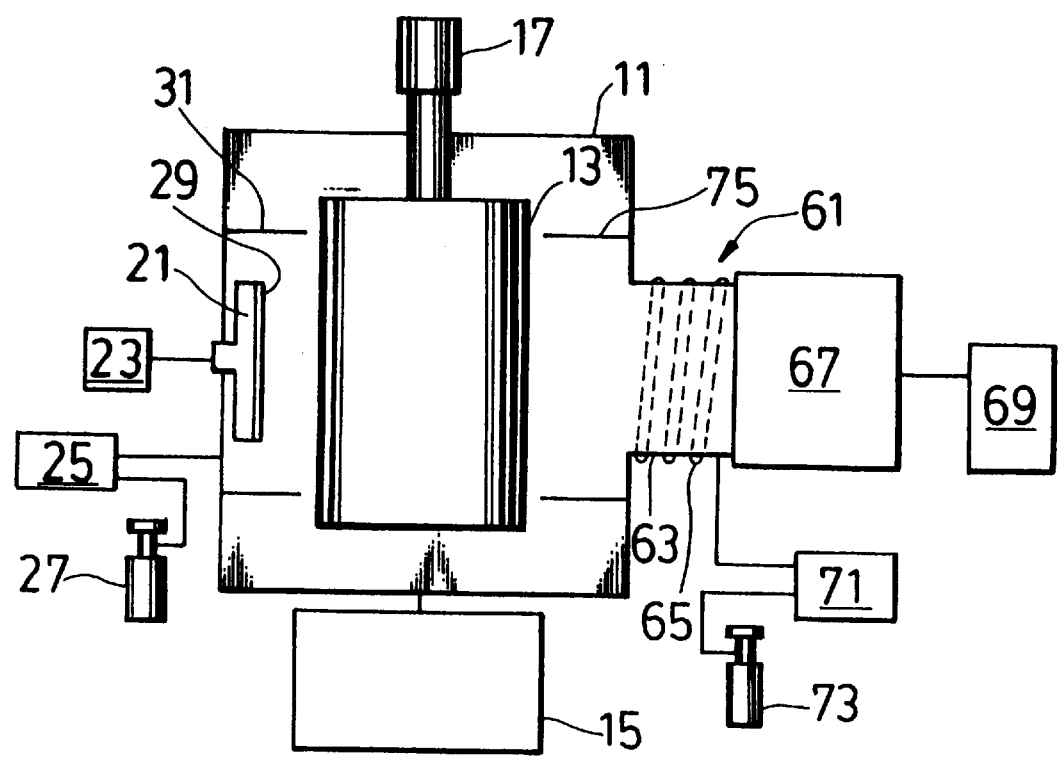
FIG. 2 is a schematic side view as viewed along the line A-B-C of FIG. 1.

The transfer means of the present embodiment will now be described specifically. As shown in FIGS. 1 and 2, the substantially cylindrical substrate holder 13 serving as the transfer means is disposed at the center of the vacuum chamber 11 in a manner rotatable at a predetermined speed. The substrate holder 13 is rotatably supported by unillustrated bearing portions in the vacuum chamber 11. The bearing portions may be formed inside or outside the vacuum chamber 11. The substrate holder 13 is connected to the output shaft of a rotational drive 17 (motor) and rotated by the rotating output shaft.

The rotational drive 17 is configured such that the rotational speed thereof can be controlled. A substrate (not shown) is mounted on the substrate holder 13 and transferred sequentially and repeatedly between the thin film deposition portions for forming a thin film through sputtering in the film deposition process chambers 20 and 40 and the exposure-to-radicals portion for exposing a thin film to radicals of a reactive gas emitted from the radical source in the reaction process chamber 60.

EXAMPLES

Sputtering conditions and conditions for generating the activated species of a reactive gas are as follows:
(1) Sputtering conditions (Si)
   Applied power: 0–2.8 kW
   Substrate temperature: room temperature
   Argon flux: 300 sccm
   Rotational speed of substrate holder: 100 rpm
   Thickness of ultra-thin film: 2–6 angstroms
(2) Sputtering conditions (Ta)
   Applied power: 0–1.5 kW
   Substrate temperature: room temperature
   Argon flux: 200 sccm
   Rotational speed of substrate holder: 100 rpm
   Thickness of ultra-thin film: 1–4 angstroms
(3) Conditions for generating radicals of reactive gas ($O_2$)
   Applied power: 2.0 kW
   Oxygen flux: 60 sccm In order to describe the present invention, there will next be described, by way of example, the case where a thin film of a composite metal compound of $SiO_2$ and $Ta_2O_2$ is deposited under the above sputtering conditions and conditions for generating the activated species of a reactive gas.

Silicon (Si) is sputtered in the steps of: fixing silicon serving as the target 29 in place; introducing argon gas into the film deposition process chamber 20 from the sputtering gas cylinder 27; and applying power to the target 29 from the sputtering power source 23. Tantalum (Ta) is sputtered in the steps of: fixing tantalum serving as the target 29 in place; introducing argon gas into the film deposition process chamber 40 from the sputtering gas cylinder 47; and applying power to the target 29 from the sputtering power source 43.

Figure 3:
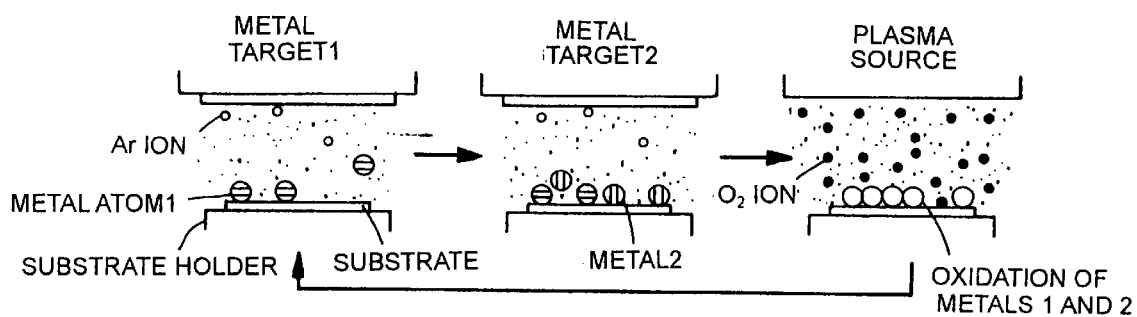
FIG. 3 is an explanatory view showing the process of forming a thin film of a composite metal compound on a substrate.

A refractive index to be obtained depends on the ratio between the power applied to one magnetron sputtering target and the power applied to the other magnetron sputtering target in FIG. 3. Oxygen gas is introduced into the activated-species generator 61 from the reactive gas cylinder 73, and the activated-species generator 61 is activated, thereby generating the activated species of oxygen gas (oxygen atoms).

As the substrate holder 13 carrying a substrate is rotated by the rotational drive 17 (motor), an Si ultra-thin film is deposited on the substrate when the substrate is located in front of the sputtering electrode 21 (the sputtering thin-film deposition portion) in the film deposition process chamber 20. Next, a Ta ultra-thin film is deposited on the substrate when the substrate is located in front of the sputtering electrode 41 (the sputtering thin-film deposition portion) in the film deposition process chamber 40. The thus-formed thin film of the composite metal is oxidized by the activated species of oxygen gas when the substrate is located in front of the grid 62 (the exposure-to-radicals portion) in the reaction process chamber 60. As a result, the thin film of the composite metal is converted to a thin film of a composite metal compound of $SiO_2$ and $Ta_2O_2$.

The substrate holder 13 carrying the substrate is rotated so as to repeat the deposition of an ultra-thin film of Si and Ta and the conversion of the ultra-thin film of Si and Ta to a thin film of a composite compound of $SiO_2$ and $Ta_2O_2$ until a thin film of a composite compound of $SiO_2$ and $Ta_2O_2$ having a desired thickness is obtained.

Spaces in front of the sputtering electrodes 21 and 41 are enclosed by the shield plates 31 and 51, respectively, and a space in front of the grid 62 is enclosed by the shield plates 75. A sputtering gas is introduced into the corresponding enclosed spaces from the sputtering gas cylinders 27 and 47, and a reaction gas is introduced into the corresponding enclosed space from the reaction gas cylinder 73. The thus-introduced gases are evacuated into an evacuation system by a vacuum pump 15. Accordingly, the sputtering gas does not enter the space enclosed by the shield plates 75, or the reactive gas does not enter the spaces enclosed by the shield plates 31 and 51.

Also, discharge associated with magnetron sputtering and discharge associated with the generation of the activated species of a reaction gas can be controlled independently of each other to thereby have no effect on each other, and thus are performed stably, thereby avoiding the occurrence of an unexpected accident and providing a high reliability. Further, since the activated-species generator 61 is configured not to expose a substrate to plasma, the substrate is free from various damages which would otherwise result due to charged particles. Also, the substrate temperature can be controlled to 100° C. or lower to thereby avoid an unfavorable temperature rise. In the case of a plastic substrate, since the substrate temperature does not exceed 100° C., a glass transition point is not exceeded during sputtering. Thus, the plastic substrate does not suffer deformation or like damage.

Figure 4:
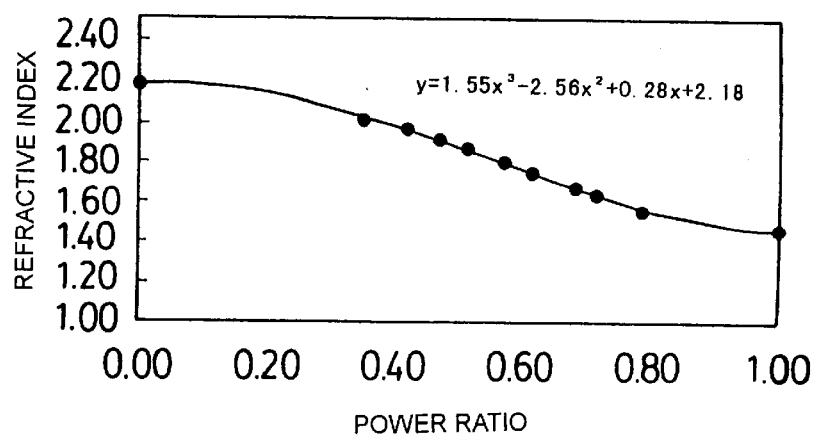
FIG. 4 is a graph showing the relation between power ratio and refractive index.

The above-mentioned phenomena will now be described with reference to FIGS. 4 to 7. FIGS. 4 to 7 show the relation among power and optical characteristics, such as refractive index, extinction coefficient, and heterogeneity, of $Ta_xSi_yO_z$. Optical constants are calculated based on data regarding the spectral characteristics of a single-layer film. As shown in FIG. 4, the refractive indices of $Ta_xSi_yO_z$ films vary with the ratio of the power applied to one guide to the power applied to the other guide. As seen from FIG. 4, as the applied power ratio between the Si cathode and the Ta cathode increases, the refractive index decreases.

Since the vapor deposition rate is fixed at 40 nm/min, the illustrated relationship between the refractive index and the applied power ratio holds. As a result, the minimum and maximum refractive indices at a wavelength of 550 nm are found 1.463 and 2.182, respectively. As the applied power ratio increases, the refractive index at a wavelength of 550 nm increases from 1.463 to 2.182. Also, the refractive index can be decreased from 2.182 to 1.463.

Figure 5:
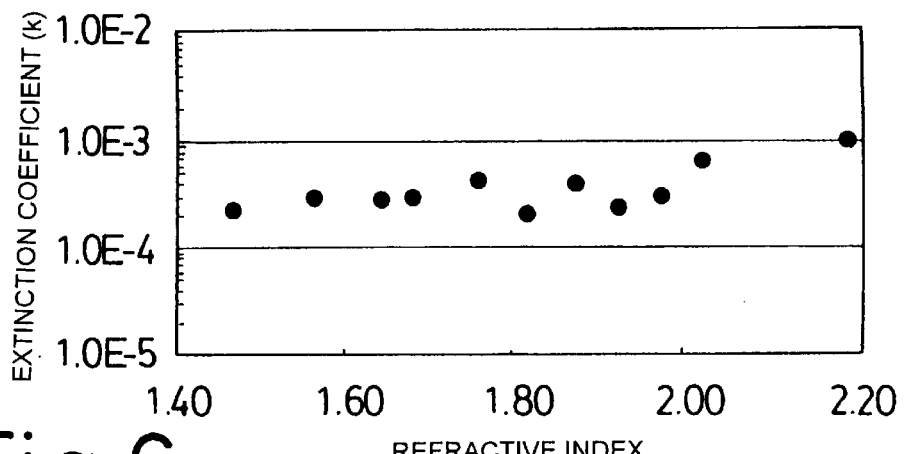
FIG. 5 is a graph showing the relation between extinction coefficient and refractive index.
Figure 6:
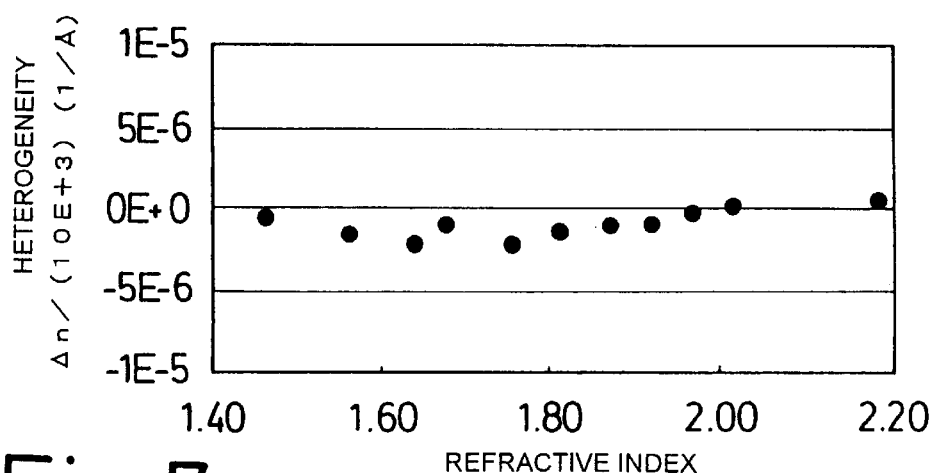
FIG. 6 is a graph showing the relation between heterogeneity and refractive index for a plurality of thin films.

FIG. 5 shows the relation between extinction coefficient and refractive index, and FIG. 6 shows the relation between heterogeneity and refractive index for a plurality of thin films. As shown in FIG. 5, the extinction coefficients of thin films having a refractive index of 1.463 to 2.00 at a wavelength of 550 nm are smaller than $5 \times 10^{-4}$. The extinction coefficients of thin films having a refractive index of 2.00 to 2.182 are smaller than $1 \times 10^{-3}$. As seen from FIG. 6, the thin films show a very small heterogeneity. Thin films having a refractive index not higher than 2.00 are negatively heterogeneous. Thin films having a refractive index higher than 2.00 are positively heterogeneous.

Based on the above findings, a 3-layer antireflection film having an intermediate-refractive-index layer and a 2-layer antireflection film having a refractively gradient layer were designed and fabricated. The fabricated film configurations were as follows:

(1) substrate/M(λ/4)/2H(λ/2)/L(λ/4)/air; and
(2) substrate/G/L(λ/4)/air (G: refractively gradient layer).

Figure 7:
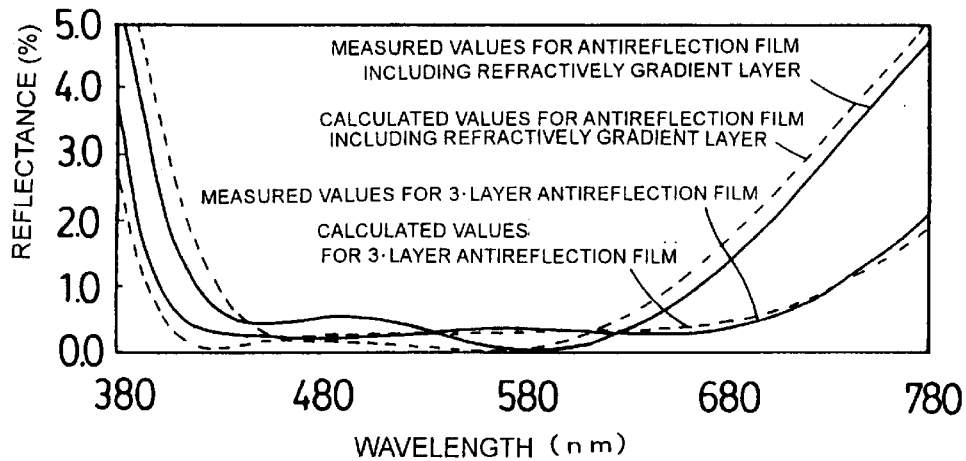
FIG. 7 is a graph showing the relation between reflectance and wavelength for comparison between calculated values and experimental values.

The refractive index of the intermediate-refractive-index layer M is represented by $n_m = n_1\sqrt{n_s}$, where $n_m$ is the refractive index of the intermediate-refractive-index layer M, $n_1$ is the refractive index of the low-refractive-index layer, and $n_s$ is the refractive index of the substrate. The 2-layer antireflection film was designed based on the conventional 2-layer antireflection design called w-coat; specifically substrate/2H(λ/2)/L(λ/4)/air. FIG. 7 shows the calculated and measured spectral curves of the 3-layer and 2-layer antireflection films. As seen from FIG. 7, the calculated values and the measured values are in good coincidence. In the case of the 2-layer antireflection film, the high-refractive-index layer of the conventional w-coat was replaced by a refractively gradient layer, thereby expanding the range of antireflection.

The present invention includes the following embodiments:

An apparatus for forming a thin film of a composite metal compound, wherein the multi-aperture grid is formed of a metal or an insulator in which are formed a number of apertures having a diameter of 0.1–3 mm, and is cooled.

An apparatus for forming a thin film of a composite metal compound, wherein the multi-slit grid is formed of a metal or an insulator in which are formed a number of slits having a width of 0.1–1 mm, and is cooled.

A method for forming a thin film of a composite metal compound comprising the steps of: sputtering at least two independent different metals so as to form on a substrate an ultra-thin film of a composite metal or an incompletely-reacted composite metal; and irradiating the ultra-thin film with the electrically neutral, activated species of a reactive gas so as to convert the composite metal or the incompletely-reacted composite metal to a composite metal compound through the reaction of the ultra-thin film with the activated species of the reactive gas, wherein the step of forming the ultra-thin film and the step of conversion to the composite metal compound are sequentially repeated so as to form on the substrate a thin film of the composite metal compound having a desired thickness, and wherein there is imparted to the thin film any refractive index within the range between the optical refractive index intrinsic to a constituent metal compound of the thin film and the optical refractive index intrinsic to another constituent metal compound of the thin film through the continuous variation of the refractive index of the thin film in the direction of the thickness of the thin film.

What is claimed is:

1. A method for forming a thin film of a composite metal compound comprising the steps of:

sputtering independent targets formed of at least two different metals so as to form on a substrate an ultra-thin film of a composite metal or an incompletely-reacted composite metal;

forming a flow of a reactive gas containing electrically neutral, activated species from a plasma including enriching the electrically neutral, activated species relative to electrically charged species;

irradiating the ultra-thin film with the flow of reactive gas so as to convert the composite metal or the incompletely-reacted composite metal to a composite metal compound through the reaction of the ultra-thin film with the electrically neutral, activated species in the reactive gas; and sequentially repeating the step of forming the ultra-thin film and the step of irradiating so as to form on the substrate a thin film of the composite metal compound having a desired thickness.

2. A method for forming a thin film of a composite metal compound according to claim 1, wherein the electrically neutral, activated species of the reactive gas are radicals selected from the group consisting of atoms having at least one unpaired electron, molecules having at least one unpaired electron, atoms in an excited state, and molecules in an excited state.

3. A method for forming a thin film of a composite metal compound according to claim 1, wherein sputtering is magnetron sputtering.

4. A method for forming a thin film of a composite metal compound according to claim 1, wherein said sputtering is performed by applying a negative voltage to each of the targets and said negative voltage is inverted at 1–200 kHz intervals to a positive voltage ranging between +50 V and +200 V to thereby neutralize, with electrons in plasma, positive charges which accumulate in a compound to be formed on the surface of each of the targets.

5. A method for forming a thin film of a composite metal compound comprising the steps of:

sputtering independent targets formed of at least two different metals so as to form on a substrate an ultra-thin film of a composite metal or an incompletely-reacted composite metal;

forming a flow of a reactive gas containing electrically neutral, activated species from a plasma including enriching the electrically neutral, activated species relative to electrically charged species;

irradiating the ultra-thin film with the flow of reactive gas so as to convert the composite metal or the incompletely-reacted composite metal to a composite metal compound through the reaction of the ultra-thin film with the electrically neutral, activated species in the reactive gas; and sequentially repeating the step of forming the ultra-thin film and the step of irradiating so as to form on the substrate a thin film of the composite metal compound having a desired thickness, whereby the thin film is formed to have a refractive index within the range between the optical refractive index intrinsic to a constituent metal compound of the thin film and the optical refractive index intrinsic to another constituent metal compound of the thin film.

6. A method for forming a thin film of a composite metal compound according to claim 5, wherein the electrically neutral, activated species of the reactive gas are radicals selected from the group consisting of atoms having at least one unpaired electron, molecules having at least one unpaired electron, atoms in an excited state, and molecules in an excited state.

7. A method for forming a thin film of a composite metal compound according to claim 5, wherein said sputtering is performed by applying a negative voltage to each of the targets and said negative voltage is inverted at 1–200 kHz intervals to a positive voltage ranging between +50 V and +200 V to thereby neutralize, with electrons in plasma, positive charges which accumulate in a compound to be formed on the surface of each of the targets.

8. A method for forming a thin film of a composite metal compound according to claim 5 wherein said enriching of electrically neutral, activated species from plasma is performed by selection of electrically neutral, activated species in the plasma.

9. A method for forming a thin film of a composite metal compound according to claim 1 wherein said forming the flow of reactive gas is performed by passing a gas flow through a space surrounded by a radio-frequency coil and generating a magnetic field within said space surrounded by the radio-frequency coil to form a plasma, and passing the plasma through a grid to remove electrons and ions from the plasma to form the flow of reactive gas.

10. A method for forming a thin film of a composite metal compound according to claim 5 wherein said forming the flow of reactive gas is performed by passing a gas flow through a space surrounded by a radio-frequency coil and generating a magnetic field within said space surrounded by the radio-frequency coil to form a plasma, passing the plasma through a grid to remove electrons and ions from the plasma to form the reactive gas.

11. A method for forming a thin film of a composite metal compound according to claim 1 wherein said enriching of electrically neutral, activated species from plasma is performed by selection of electrically neutral, activated species in the plasma.

* * * * *

UNITED STATES PATENT AND TRADEMARK OFFICE
CERTIFICATE OF CORRECTION

PATENT NO. : 6,207,536 B1
DATED : March 27, 2001
INVENTOR(S) : Matsumoto et al.

It is certified that error appears in the above-identified patent and that said Letters Patent is hereby corrected as shown below:

Column 1,
Line 20, delete "by" insert -- of -- ;
Line 47, delete "(1.46-2.40)";
Line 48, after "index" insert -- (1.46-2.40) --
Line 53, delete "involve" insert -- suffer from --.

Column 6,
Line 7, "Least" should read -- least --.

Signed and Sealed this

Twentieth Day of August, 2002

Attest:

Attesting Officer

JAMES E. ROGAN
Director of the United States Patent and Trademark Office